United States Patent
Guo et al.

(10) Patent No.: US 10,781,343 B2
(45) Date of Patent: Sep. 22, 2020

(54) ACID POLISHING COMPOSITION AND METHOD OF POLISHING A SUBSTRATE HAVING ENHANCED DEFECT INHIBITION

(71) Applicant: Rohm and Haas Electronic Materials CMP Holdings, Inc., Newark, DE (US)

(72) Inventors: Yi Guo, Newark, DE (US); David Mosley, Lafayette Hill, PA (US)

(73) Assignee: Rohm and Haas Electronic Materials CMP Holdings, Inc., Newark, DE (US)

( * ) Notice: Subject to any disclaimer, the term of this patent is extended or adjusted under 35 U.S.C. 154(b) by 0 days.

(21) Appl. No.: 16/256,593

(22) Filed: Jan. 24, 2019

(65) Prior Publication Data
US 2020/0239734 A1    Jul. 30, 2020

(51) Int. Cl.
| | | |
|---|---|---|
| C09G 1/02 | (2006.01) |
| H01L 21/306 | (2006.01) |
| B24B 37/04 | (2012.01) |
| B24B 1/00 | (2006.01) |
| C09G 1/00 | (2006.01) |
| C09K 3/14 | (2006.01) |
| C09G 1/04 | (2006.01) |
| C09G 1/06 | (2006.01) |
| C09K 13/06 | (2006.01) |
| H01L 21/321 | (2006.01) |

(52) U.S. Cl.
CPC ............... *C09G 1/02* (2013.01); *B24B 1/00* (2013.01); *B24B 37/044* (2013.01); *C09G 1/00* (2013.01); *C09G 1/04* (2013.01); *C09G 1/06* (2013.01); *C09K 3/1454* (2013.01); *C09K 3/1463* (2013.01); *C09K 13/06* (2013.01); *H01L 21/30625* (2013.01); *H01L 21/3212* (2013.01)

(58) Field of Classification Search
None
See application file for complete search history.

(56) References Cited

U.S. PATENT DOCUMENTS

| | | | |
|---|---|---|---|
| 6,229,659 B1 | 5/2001 | Watkins et al. | |
| 7,044,836 B2 | 5/2006 | Sun et al. | |
| 2009/0081871 A1* | 3/2009 | Dysard | C09G 1/02 438/693 |
| 2012/0311935 A1* | 12/2012 | Kujat | B24B 37/245 51/298 |

* cited by examiner

*Primary Examiner* — Jiong-Ping Lu
(74) *Attorney, Agent, or Firm* — John J. Piskorski

(57) ABSTRACT

An acid chemical mechanical polishing composition includes colloidal silica abrasive particles having a positive zeta potential, and select alkoxysilane succinic acid anhydride compounds to enhance the reduction of defects on dielectric materials of substrates such as silicon dioxide and silicon nitride. Also disclosed are methods for polishing a substrate with the acid chemical mechanical polishing composition to remove some of the dielectric materials such as silicon dioxide and silicon nitride.

10 Claims, No Drawings

ACID POLISHING COMPOSITION AND METHOD OF POLISHING A SUBSTRATE HAVING ENHANCED DEFECT INHIBITION

FIELD OF THE INVENTION

The present invention is directed to an acid polishing composition and method of polishing a substrate having enhanced defect reduction with good dielectric removal rate. More specifically, the present invention is directed to an acid polishing composition and method of polishing a substrate having enhanced defect reduction with good dielectric removal rate, wherein the acid polishing composition includes colloidal silica abrasive particles having a positive zeta potential and select alkoxysilane succinic acid anhydride compounds to enhance the reduction of defects on substrates which include dielectrics of silicon dioxide and silicon nitride, and wherein at least some of the dielectrics is removed from the substrate.

BACKGROUND OF THE INVENTION

In the fabrication of integrated circuits and other electronic devices, multiple layers of conducting, semiconducting and dielectric materials are deposited on or removed from a surface of a semiconductor wafer. Thin layers of conducting, semiconducting, and dielectric materials can be deposited by several deposition techniques. Common deposition techniques in modern processing include physical vapor deposition (PVD), also known as sputtering, chemical vapor deposition (CVD), plasma-enhanced chemical vapor deposition (PECVD), and electrochemical plating (ECP).

As layers of materials are sequentially deposited and removed, the uppermost surface of the wafer becomes non-planar. Because subsequent semiconductor processing (e.g., metallization) requires the wafer to have a flat surface, the wafer needs to be planarized. Planarization is useful in removing undesired surface topography and surface defects, such as rough surfaces, agglomerated materials, crystal lattice damage, scratches, and contaminated layers or materials.

Chemical mechanical planarization, or chemical mechanical polishing (CMP), is a common technique used to planarize substrates, such as semiconductor wafers. In conventional CMP, a wafer is mounted on a carrier assembly and positioned in contact with a polishing pad in a CMP apparatus. The carrier assembly provides a controllable pressure to the wafer, pressing it against the polishing pad. The pad is moved (e.g., rotated) relative to the wafer by an external driving force. Simultaneously therewith, a polishing composition ("slurry") or other polishing solution is provided between the wafer and the polishing pad. Thus, the wafer surface is polished and made planar by the chemical and mechanical action of the pad surface and slurry.

Certain advanced device designs demand polishing compositions that provide good silicon dioxide and silicon nitride removal efficiency at lower point-of-use (POU) abrasive wt % as well as reduced scratch defects for the improvement of polishing processes throughout and product yield %. As the size of structures on semiconductors devices continue to shrink, performance criteria which was once acceptable for planarizing and reducing defects of polishing dielectric materials becomes increasingly less acceptable. Scratches which were once considered acceptable are today becoming yield limiting.

Accordingly, there is a need for polishing compositions and polishing methods that exhibit desirable planarization efficiency, uniformity, and dielectric removal rate while minimizing defects such as scratches.

SUMMARY OF THE INVENTION

The present invention provides an acid chemical mechanical polishing composition, comprising, as initial components: water;
colloidal silica abrasive particles having a positive zeta potential;
an alkoxysilane succinic acid anhydride compound having formula (I):

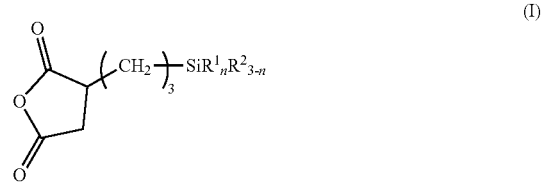

wherein $R^1$ is selected from $(C_1\text{-}C_4)$alky when n is 1 or 2; $R^2$ is methoxy, ethoxy, or methoxyethyleneoxy; and n can be 0, 1 or 2;
a pH<7; and
optionally one or more additives chosen from a pH adjusting agent, a quaternary ammonium compound and a biocide.

The present invention also provides an acid chemical mechanical polishing composition, comprising, as initial components:
water; 0.1 to 40 wt % of a colloidal silica abrasive having a positive zeta potential;
0.0001 to 0.1 wt % of an alkoxysilane succinic acid anhydride compound having formula

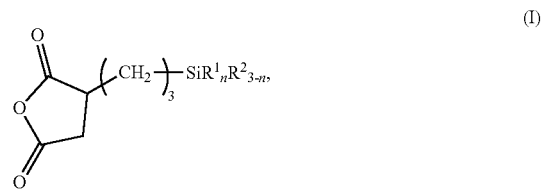

wherein $R^1$ is selected from $(C_1\text{-}C_4)$alkyl when n is 1 or 2; $R^2$ is methoxy, ethoxy, or methoxyethyleneoxy; and n can be 0, 1 or 2;
a pH of 2 to 6.5; and
optionally one or more additives chosen from a pH adjusting agent, a quaternary ammonium compound and a biocide.

The present invention further provides a method for chemical mechanical polishing of a substrate, comprising:
providing a substrate, wherein the substrate comprises dielectric materials of silicon dioxide, silicon nitride or combinations thereof;
providing an acid chemical mechanical polishing composition, comprising, as initial components:
water;
colloidal silica abrasive particles having a positive zeta potential;
an alkoxysilane succinic acid anhydride compound having formula (I):

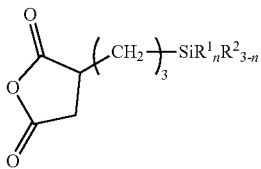

wherein $R^1$ is selected from $(C_1-C_4)$alkyl when n is 1 or 2; $R^2$ is methoxy, ethoxy, or methoxyethyleneoxy; and n can be 0, 1 or 2: a pH<7; and optionally one or more additives chosen from a pH adjusting agent, a quaternary ammonium compound and a biocide;

providing a chemical mechanical polishing pad with a polishing surface;

creating dynamic contact at an interface between the polishing surface of the chemical mechanical polishing pad and the substrate with a down force of 0.69 to 34.5 kPa; and dispensing the acid chemical mechanical polishing composition onto the chemical mechanical polishing pad at or near the interface between the acid chemical mechanical polishing pad and the substrate; and wherein the substrate is polished and some of the dielectric material is polished away.

The acid chemical mechanical polishing composition and method of the present invention enable enhanced reduction of defects, and good silicon dioxide and silicon nitride removal rates.

DETAILED DESCRIPTION OF THE INVENTION

As used throughout this specification the following abbreviations have the following meanings, unless the context indicates otherwise: ° C.=degrees Centigrade; g=grams; L=liters; mL=milliliters; μ=μm=microns; kPa=kilopascal; Å=angstroms; mm=millimeters; cm=centimeter; nm=nanometers; min=minute; rpm=revolutions per minute; lbs=pounds; kg=kilograms; wt %=percent by weight; RR=removal rate; Si=silicon; $Si_3N_4$=silicon nitride; DEAMS=(N,N-diethylaminomethyl) triethoxysilane, 98% (Gelest Inc., Morrisville, Pa.); TMOS=tetramethyl orthosilicate; TMAH=tetramethyl ammonium hydroxide; TEA=tetraethyl ammonium; and EDA=ethylenediamine; PS=Polishing Slurry of the Invention; CS=Comparative Polishing Slurry.

The term "chemical mechanical polishing" or "CMP" refers to a process where a substrate is polished by means of chemical and mechanical forces alone and is distinguished from electrochemical-mechanical polishing (ECMP) where an electric bias is applied to the substrate. The term "TEOS" means the silicon oxide formed from the decomposition of tetraethyl orthosilicate ($Si(OC_2H_5)_4$). The term "composition" and "slurry" are used interchangeably through-out the specification. The term "alkylene" is synonymous with the more current chemical term for the organic group—"alkanediyl". The term "halide" means chloride, bromide, fluoride and iodide. The terms "a" and "an" refer to both the singular and the plural. All percentages are by weight, unless otherwise noted. All numerical ranges are inclusive and combinable in any order, except where it is logical that such numerical ranges are constrained to add up to 100%.

The acid chemical mechanical polishing composition and method of the present invention is useful for polishing a substrate comprising dielectric materials including silicon dioxide, silicon nitride or combinations thereof and having improved polishing defectivity performance on the dielectric materials. The acid chemical mechanical polishing composition of the present invention contains (preferably consists of) water; an alkoxysilane succinic acid anhydride compound to reduce defects and scratches on dielectric materials having formula (I):

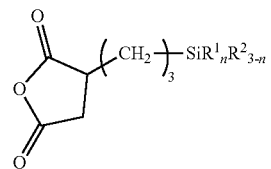

wherein $R^1$ is selected from $(C_1-C_4)$alkyl, such as methyl, ethyl, propyl or butyl, preferably, methyl or ethyl, more preferably, methyl, when variable n is 1 or 2; $R^2$ is methoxy, ethoxy, or methoxyethyleneoxy, preferably, methoxy and ethoxy, more preferably ethoxy; and the variable n can be 0, 1 or 2; wherein $R^1$ and $R^2$ are covalently bonded to Si; and when n=0, only $R^2$ is covalently bonded to Si; a pH<7; and optionally one or more additives chosen from a pH adjusting agent, a quaternary ammonium compound and a biocide.

The term "improved polishing defectivity performance" used herein and in the appended claims to describe the defectivity performance obtained through the inclusion of an alkoxysilane succinic anhydride compound having formula (I) in the acid chemical mechanical polishing composition used for the acid chemical mechanical polishing method of the present invention means that at least the following expression is satisfied:

$$X < X_0 \quad \text{(Eq. I)},$$

wherein X is the defectivity (i.e., post CMP/hydrogen fluoride (HF) scratches) for an acid chemical mechanical polishing composition containing the substances used in the method of the present invention, as measured under the polishing conditions set forth in the Examples; and $X_0$ is the defectivity (i.e., post CMP/hydrogen fluoride scratches) obtained under identical conditions with only silica abrasives having a (+) positive zeta potential present.

Exemplary preferred alkoxysilane succinic acid anhydride compounds of formula (I) consist of the following:
3-trimethoxysilylpropyl succinic acid anhydride ($R^2$=methoxy and n=0);
3-methyldimethoxysilylpropyl succinic acid anhydride ($R^1$=methyl, $R^2$=methoxy and n=1);
3-dimethylmethoxysilylpropyl succinic acid anhydride ($R^1$=methyl, $R^2$=methoxy and n=2);
3-triethoxysilylpropyl succinic acid anhydride ($R^2$=ethoxy and n=0);
3-methyldiethoxysilylpropyl succinic acid anhydride ($R^1$=methyl, $R^2$=ethoxy and n=1);
3-dimethylethoxysilylpropyl succinic acid anhydride ($R^1$=methyl, $R^2$=ethoxy and n=2);
3-tris-(methoxyethylenoxy)-silylpropyl succinic acid anhydride ($R^2$=methoxyethylenoxy and n=0);
3-methylbis-(methoxyethylenoxy)-silylpropyl succinic acid anhydride ($R^1$=methyl, $R^2$=methoxyethylenoxy and n=1); and 3-dimethylmethoxyethylenoxysilylpropyl succinic acid anhydride ($R^1$=methyl, $R^2$=methoxyethylenoxy and n=2).

A most preferred alkoxysilane succinic acid anhydride of the present invention is 3-triethoxysilylpropyl succinic acid anhydride having formula (II):

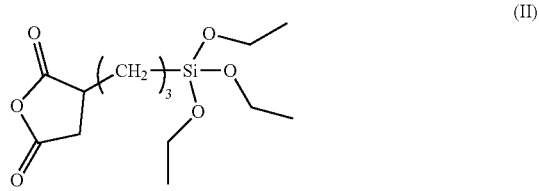

(II)

The acid chemical mechanical polishing composition used in the acid chemical mechanical polishing method of the present invention contains as an initial component, 0.0001 to 0.1 wt % of an alkoxysilane succinic acid anhydride having formula (I) or formula (II), preferably, 0.00075 to 0.006 wt %, more preferably, 0.003 to 0.006 wt % of the alkoxysilane succinic acid anhydrides having formula (I) or formula (II).

The water contained in the chemical mechanical polishing composition used in the chemical mechanical polishing method of the present invention is preferably at least one of deionized and distilled to limit incidental impurities.

The acid chemical mechanical polishing composition used in the acid chemical mechanical polishing method of the present invention contains 0.1 to 40 wt % colloidal silica abrasives having a net positive zeta potential; preferably, 1 to 25 wt % colloidal silica abrasives having a net positive zeta potential, more preferably, 1 to 12 wt %, most preferably, 1 to 3 wt %. The colloidal silica abrasives having a net positive zeta potential preferably have an average particle size of <200 nm; more preferably, 75 to 150 nm; most preferably, 100 to 150 nm, as measured by dynamic light scattering techniques (DLS).

In the acid chemical mechanical polishing compositions of the present invention, the acid chemical mechanical polishing compositions provided, contain, as initial components, colloidal silica abrasive particles having a positive zeta potential, wherein the colloidal silica abrasive particles comprise a nitrogen-containing compound. Such nitrogen-containing compounds can be incorporated within the colloidal silica abrasive particles, or can be incorporated on a surface of the colloidal silica abrasive particles, or the chemical mechanical polishing compositions of the present invention can contain, as initial components, colloidal silica abrasive particles having a combination, wherein the nitrogen-containing compounds are incorporated within the colloidal silica abrasive particles having the positive zeta potential, and, wherein, the nitrogen-containing compounds are incorporated on a surface of the colloidal silica abrasive particles.

Colloidal silica abrasive particles comprising nitrogen-containing compounds are commercially available, or can be prepared by those of ordinary skill in the art as described in the chemical and colloidal silica abrasive particle literature. Examples of commercially available colloidal silica particles comprising nitrogen-containing compounds are KLEBOSOL™ 1598-B25 surface modified colloidal silica particles (manufactured by AZ Electronics Materials, available from The Dow Chemical company, Midland, Mich.); and FUSO™ BS-3 (Fuso Chemical Co., Ltd., Osaka, Japan).

Such colloidal silica abrasive particles are preferably prepared by the Stober process, well known to those of ordinary skill in the art.

The acid chemical mechanical polishing compositions of the present invention can have colloidal silica abrasive particles having a positive zeta potential comprising nitrogen-containing compounds mixed with colloidal silica abrasive particles without nitrogen-containing compounds. Abrasives suitable for practicing the present invention, include, but are not limited to, DEAMS surface modified FUSO BS-3™ abrasive slurry (80 ppm DEAMS to 1 wt % silica) and KLEBOSOL™ 1598-B25 slurry (manufactured by AZ Electronics Materials, available from The Dow Chemical company). Mixtures of such abrasives can also be used.

Preferably, the colloidal silica abrasive particles having a positive zeta potential of the present invention comprise (on a surface of colloidal silica abrasive particles, within colloidal silica abrasive particles, or combinations thereof) nitrogen-containing compounds which include, but are not limited to, ammonium compounds having a general formula:

$$R^3R^4R^5R^6N^+$$ (III)

wherein $R^3$, $R^4$, $R^5$ and $R^6$ are independently chosen from hydrogen, ($C_1$-$C_6$)alkyl, ($C_7$-$C_{12}$) arylalkyl and ($C_6$-$C_{10}$) aryl. Such groups can be substituted with one or more hydroxyl groups. Such colloidal silica abrasives containing ammonium compounds can be prepared from methods known in the art or in the literature.

Examples of such nitrogen-containing ammonium compounds are tetramethylammonium, tetraethylammonium, tetrapropylammonium, tetrabutylammonium, tetrapentylammonium, ethtyltrimethylammonium and diethyldimethylammonium.

Nitrogen-containing compounds can also include, but are not limited to, compounds having an amino group such as a primary amine, a secondary amine, a tertiary amine or a quaternary amine. Such nitrogen-containing compounds can also include an amino acid having from one to eight carbon atoms such as lysine, glutamine, glycine, iminodiacetic acid, alanine, valine, leucine, isoleucine, serine and threonine.

In various embodiments, a molar ratio of the chemical species to silica in the colloidal silica abrasive particles of the present invention is preferably greater than 0.1% and less than 10%.

Aminosilane compounds are the most preferred nitrogen-containing compounds to incorporate on surfaces or into colloidal silica abrasive particles of the chemical mechanical polishing compositions of the present invention. Such aminosilane compounds include, but are not limited to, primary aminosilanes, secondary aminosilanes, tertiary aminosilanes, quaternary aminosilanes and multi-podal (e.g., dipodal) aminosilanes. The aminosilane compound can include substantially any suitable aminosilane. Examples of aminosilanes which can be used to practice the present invention are bis(2-hydroxyethyl)-3-aminopropyl trialkoxysilane, diethylaminomethyltrialkoxysilane, (N,N-diethyl-3-aminopropyl)trialkoxysilane), 3-(N-styrylmethyl-2-aminoethyl-aminopropyl tiralkoxysilane), aminopropyl trialkoxysilane, (2-N-benzylaminoethyl)-3-aminopropyl trialkoxysilane), trialkoxysilyl propyl-N,N,N-trimethyl ammonium, N-(trialkoxysilylyethyl)benzyl-N,N,N-trimethyl ammonium, (bis(methyldialkoxysiylylpropyl)-N-methyl amine, bis(trialkoxysilylpropyl)urea, bis(3-(triakoxysilyl)propyl)-ethylenediamine, bis(trialkoxysilylpropyl)amine, bis(trialkoxysilylpropyl)amine, 3-aminopropyltrialkoxysilane, N-(2-aminoethyl)-3-aminopropylmethyldialkoxysilane, N-(2-aminoethyl)-3-aminopropyltrialkoxysilane, 3-aminopropylmethyldialkoxysilane, 3-aminopropyltrialkoxysilane, 3-aminopropyltriethoxysilane, (N-trialkoxysilylpropyl) polyethyleneimine, trialkoxysilylpropoyldiethylentriamine, N-phenyl-3-aminopropyltrialkoxysilane, N-(vinylbenzyl)-2-aminoethyl-3-aminopropyltrialkoxysilane, 4-aminobutyl-trialkoxysilane, (N,N-diethylaminomethyl) triethoxysilane, and mixtures thereof. Those of ordinary skill in the art readily appreciate that aminosilane compounds are commonly hydrolyzed (or partially hydrolyzed) in an aqueous medium. Thus, by reciting an aminosilane compound, it is understood that the aminosilane or a hydrolyzed (or partially hydrolyzed) species or condensed species thereof can be incorporated in the colloidal silica abrasive particles.

In various embodiments, a molar ratio of the aminosilane species to silica in the colloidal silica abrasive particles is preferably greater than 0.1% and less than 10%.

Colloidal silica abrasive particles which include nitrogen containing compounds incorporated within the colloidal silica abrasive particles are preferably prepared by the Stober process, wherein organic alkoxysilanes, such as TMOS and TEOS are used as precursors for silica synthesis and nitrogen-containing compounds are used as catalysts. The TMOS and TEOS as precursors undergo hydrolysis and condensation in an aqueous alkaline environment. The catalysts used to maintain an alkaline pH are nitrogen-containing species, such as, but are not limited to, ammonia, TMAH, TEA and EDA. As counterions, these nitrogen-containing compounds are inevitably trapped inside the colloidal silica abrasive particles during particle growth, thus resulting in colloidal silica abrasive particles comprising nitrogen-containing compounds internally incorporated within the colloidal silica abrasive particles. Examples of a commercially available colloidal silica abrasive particles which include nitrogen-containing compounds incorporated within the particles are particles available from FUSO™, such as FUSO BS-3™ colloidal silica abrasive particles.

Optionally, the acid chemical mechanical polishing compositions provided contain, as an initial component, a pH adjusting agent. Such pH adjusting agents include dicarboxylic acids, wherein the dicarboxylic acids include, but is not limited to malonic acid, oxalic acid, succinic acid, adipic acid, maleic acid, malic acid, glutaric acid, tartaric acid, salts thereof or mixtures thereof. More preferably, the acid chemical mechanical polishing compositions provided contain, as an initial component, a dicarboxylic acid, wherein the dicarboxylic acid is selected from the group consisting of malonic acid, oxalic acid, succinic acid, tartaric acid, salts thereof and mixtures thereof. Still more preferably, the acid chemical mechanical polishing compositions provided contain, as an initial component, a dicarboxylic acid, wherein the dicarboxylic acid is selected from the group consisting of malonic acid, oxalic acid, succinic acid, salts thereof and mixtures thereof. Most preferably, the acid chemical mechanical polishing compositions provided contain, as an initial component, the dicarboxylic acid succinic acid or salts thereof. Such dicarboxylic acids are included in the acid chemical mechanical polishing compositions to maintain a desired acid pH.

The acid chemical mechanical polishing compositions used in the acid chemical mechanical polishing methods of the present invention have a pH of <7, preferably 2 to 6.5, more preferably, 3 to 6, most preferably, 4 to 5. A most preferred pH adjusting agent to maintain the acid chemical mechanical polishing composition at the desired acid pH range is succinic acid.

Optionally, the acid chemical mechanical polishing compositions of the present invention include one or more quaternary ammonium compounds. Such quaternary ammonium compounds include, but are not limited to compounds having general formula (IV):

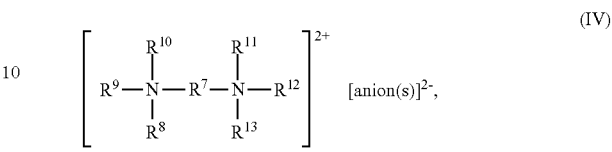

wherein $R^7$ is selected from a saturated or unsaturated $(C_1-C_{15})$alkyl, a $(C_6-C_{15})$aryl, and a $(C_6-C_{15})$aralkyl, preferably, $(C_2-C_{10})$alkyl, more preferably, $(C_2-C_6)$alkyl, still more preferably, $—(CH_2)_6—$ and a $—(CH_2)_4—$, most preferably $—(CH_2)_4—$; wherein $R^8$, $R^9$, $R^{10}$, $R^{11}$, $R^{12}$ and $R^{13}$ are each independently selected from hydrogen, a saturated or unsaturated $(C_1-C_{15})$alkyl, a $(C_6-C_{15})$aryl, a $(C_6-C_{15})$aralkyl, and a $(C_6-C_{15})$alkaryl, preferably, a hydrogen and a $(C_1-C_6)$alkyl, more preferably, a hydrogen and a butyl group, most preferably a butyl; and, wherein the anion is a counter anion to neutralize the (2+) charge of the cation, wherein the anion is hydroxide, halide, nitrate, carbonate, sulfate, phosphate or acetate, preferably, the anion is hydroxide or a halide, more preferably the anion is hydroxide. The acid chemical mechanical polishing compositions of the present invention optionally include, as an initial component, 0.001 to 1 wt %, more preferably 0.1 to 1 wt %, most preferably 0.1 to 0.3 wt % of the compound having formula (I). Most preferably, the compound having formula (IV) is N,N,N,N',N',N'-hexabutyl-1,4-butanediammonium dihydroxide.

Optionally, the acid chemical mechanical polishing compositions can contain biocides, such as KORDEX™ MLX (9.5-9.9% methyl-4-isothiazolin-3-one, 89.1-89.5% water and <1.0% related reaction product) or KATHON™ ICP III containing active ingredients of 2-methyl-4-isothiazolin-3-one and 5-chloro-2-methyl-4-isothiazolin-3-one, each manufactured by The Dow Chemical Company, (KATHON™ and KORDEX™ are trademarks of The Dow Chemical Company). Such biocides can be included in the acid chemical mechanical polishing compositions of the present invention in conventional amounts, as known to those of ordinary skill in the art.

The substrate polished in the acid chemical mechanical polishing method of the present invention comprises silicon dioxide. The silicon dioxide in the substrate includes, but is not limited to, tetraethyl orthosilicate (TEOS), borophosphosilicate glass (BPSG), plasma etched tetraethyl ortho silicate (PETEOS), thermal oxide, undoped silicate glass, high density plasma (HDP) oxide.

Optionally, the substrate polished in the acid chemical mechanical polishing method of the present invention further comprises silicon nitride. The silicon nitride in the substrate, if present, includes, but is not limited to, silicon nitride material, such as, $Si_3N_4$.

Preferably, in the method of polishing a substrate of the present invention, the chemical mechanical polishing pad provided can be any suitable polishing pad known in the art. One of ordinary skill in the art knows to select an appropriate chemical mechanical polishing pad for use in the method of the present invention. More preferably, in the method of polishing a substrate of the present invention, the chemical mechanical polishing pad provided is selected from woven and non-woven polishing pads. Still more preferably, in the method of polishing a substrate of the present invention, the chemical mechanical polishing pad provided comprises a polyurethane polishing layer. Most preferably, in the method of polishing a substrate of the present invention, the chemical mechanical polishing pad provided comprises a polyurethane polishing layer containing polymeric hollow core microparticles and a polyurethane impregnated non-woven subpad. Preferably, the chemical mechanical polishing pad provided has at least one groove on the polishing surface.

Preferably, in the method of polishing a substrate of the present invention, the chemical mechanical polishing composition provided is dispensed onto a polishing surface of the chemical mechanical polishing pad provided at or near an interface between the chemical mechanical polishing pad and the substrate.

Preferably, in the method of polishing a substrate of the present invention, dynamic contact is created at the interface between the chemical mechanical polishing pad provided and the substrate with a down force of 0.69 to 34.5 kPa normal to a surface of the substrate being polished.

In the method of polishing a substrate comprising silicon dioxide, silicon nitride or combinations thereof, polishing is done at a platen speed of 93-113 revolutions per minute, a carrier speed of 87-111 revolutions per minute, an acid chemical mechanical polishing composition flow rate of 125-300 mL/min, a nominal down force of 21.4 kPa on a 200 mm polishing machine; and, wherein the chemical mechanical polishing pad comprises a polyurethane polishing layer containing polymeric hollow core microparticles and a polyurethane impregnated non-woven subpad.

The following examples are intended to illustrate the present invention but are not intended to limit its scope.

In the following Examples, unless otherwise indicated, conditions of temperature and pressure are ambient temperature and standard pressure.

The polishing removal rate experiments were performed on eight-inch blanket wafers. An Applied Materials Mirra® polisher was used for all examples. All polishing experiments were performed using an AMAT Reflexion IC1000 polyurethane polishing pad or VisionPad 6000™ polyurethane polishing pad (commercially available from Rohm and Haas Electronic Materials CMP Inc.) with a down force of 34.5 kPa (5 psi), an acid chemical mechanical polishing composition flow rate of 125 mL/min, a table rotation speed of 93 rpm and a carrier rotation speed of 87 rpm. The removal rates were determined by measuring the film thickness before and after polishing using a KLA-Tencor FX200 metrology tool. The defectivity performances reported in the Examples were determined using a Scanning Electron Microscope after a hydrogen fluoride post polishing wash ("Pst HF"). All the TEOS wafers after Pst-HF wash were inspected using a Surfscan® SP2 defect inspection system available from KLA-Tencor. The defects information, including their coordinates on the wafer, was recorded in KLARF (KLA Results File) which was then transferred to eDR-5200 defect review system available from KLA-Tencor. A random sample of 100 defect images were selected and reviewed by a DR-5200 system. These 100 images were classified into various defect types, for example, chatter marks (scratches), particles and pad debris. Based on classification results from these 100 images, the total number of scratches on the wafer was determined.

Example 1

Chemical Mechanical Polishing Compositions

The following chemical mechanical polishing compositions are polishing slurries and were prepared to include the components and amounts disclosed in Table 1 below. The components were combined with the balance being deionized water without further adjustment of the pH. The pH was maintained with aqueous succinic acid.

TABLE 1

| Slurry# | Abrasive$^a$ (wt %) | Triethoxysilylpropyl-succinic acid anhydride (wt %) | pH |
| --- | --- | --- | --- |
| PC-1 | 2 | 0.00075 | 4.5 |
| PC-2 | 2 | 0.00375 | 4.5 |
| PC-3 | 2 | 0.003 | 4.5 |
| PC-4 | 2 | 0.006 | 4.5 |
| PC-5 | 2 | 0.006 | 4.5 |
| CS-1 | 2 | 0 | 4.5 |
| CS-2 | 2 | 0 | 4.5 |
| CS-3 | 2 | 0 | 4.5 |

$^a$Abrasive: 3:1 weight ratio of mixed abrasive of (80 ppm DEAMS to 1 wt % silica) surface modified FUSO BS-3 ™ net (+) zeta potential abrasive slurry and KLEBOSOL ™ 1598-B25 abrasive slurry with net (+) zeta potential manufactured by AZ Electronics Materials, available from The Dow Chemical Company.

Example 2

TEOS Removal Rate and Defect Performance

The TEOS removal rate and the defect performance of the chemical mechanical polishing slurry compositions of the present invention (PS-3 and PS-4) of Table 1 above in Example 1 were compared to the TEOS removal rate and the defect performance of the comparative slurry (CS-2) also disclosed in Table 1 above in Example 1. The AMAT Reflexion IC1000 polyurethane polishing pad was used to polish the substrates. The performance results are in Table 2 below.

TABLE 2

| Slurry# | TEOS RR (Å/min) | Pst-HF Total Defects | Pst-HF Scratches |
| --- | --- | --- | --- |
| CS-2 | 3507 | 259 | 40 |
| PS-3 | 3497 | 158 | 30 |
| PS-4 | 3371 | 116 | 18 |

The acid chemical mechanical polishing compositions of the present invention showed significantly reduced defects and scratches of the silicon dioxide dielectric material in contrast to the control formulation. In addition, the acid chemical mechanical polishing compositions of the present invention still had good TEOS RR even with reduced defects and scratching of the silicon dioxide dielectric material.

Example 3

TEOS Removal Rate and Defect Performance

The TEOS removal rate and the defect performance of the chemical mechanical polishing slurry compositions was repeated with CS-3 and PS-5 from Table I of Example 1 above. The VisionPad 6000™ polyurethane polishing pad was used to polish the substrates. All other polishing conditions and parameters were the same as in Example 2 above. The performance results are in Table 3 below.

TABLE 3

| Slurry# | TEOS RR (Å/min) | Pst-HF Total Defects | Pst-HF Scratches |
|---|---|---|---|
| CS-3 | 3252 | 200 | 20 |
| PS-5 | 3004 | 138 | 7 |

As in Example 2 above, the acid chemical mechanical polishing composition of the present invention showed significantly reduced defects and scratches of the silicon dioxide dielectric material in contrast to the control formulation. In addition, the acid chemical mechanical polishing composition of the present invention still had good TEOS RR.

Example 4

TEOS and SiN Removal Rates

The polishing removal rate experiments were performed on eight-inch blanket wafers. An Applied Materials Mirra® polisher was used for all examples. All polishing experiments were performed using a VisionPad 6000™ polyurethane polishing pad (commercially available from Rohm and Haas Electronic Materials CMP Inc.) with a down force of 34.5 kPa (5 psi), a chemical mechanical polishing slurry composition flow rate of 125 mL/min, a table rotation speed of 93 rpm and a carrier rotation speed of 87 rpm. The removal rates were determined by measuring the film thickness before and after polishing using a KLA-Tencor FX200 metrology tool. The polishing results are shown in Table 4 below.

TABLE 4

| Slurry# | TEOS RR (Å/min) | $Si_3N_4$ RR (Å/min) |
|---|---|---|
| CS-1 | 2296 | 234 |
| PS-1 | 2314 | 246 |
| PS-2 | 2237 | 312 |

Although introducing triethoxysilylpropyl-succinic acid anhydride enables good TEOS and $Si_3N_4$ removal rates, triethoxysilylpropyl-succinic acid anhydride appeared to exert a minor impact on targeted TEOS removal rate with a slight boost in $Si_3N_4$ removal rate.

What is claimed is:

1. An acid chemical mechanical polishing composition, consisting of, as initial components:
   water;
   colloidal silica abrasive particles having a positive zeta potential;
   an alkoxysilane succinic acid anhydride in amounts of 0.0001 to 0.1 wt % having formula (I):

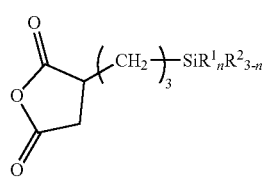

(I)

wherein $R^1$ is selected from $(C_1-C_4)$alkyl when n is 1 or 2; $R^2$ is methoxy, ethoxy, or methoxyethyleneoxy; and n can be 0, 1 or 2;
   a pH<7;
   optionally a pH adjusting agent;
   optionally a quaternary ammonium compound; and
   optionally a biocide.

2. The acid chemical mechanical polishing composition of claim 1, wherein the chemical mechanical polishing composition consists of, as initial components:
   the water;
   the colloidal silica abrasive having a positive zeta potential in amounts of 0.1 to 40 wt %;
   the alkoxysilane succinic acid anhydride of formula (I) in amounts of 0.00075 to 0.006 wt %;
   the pH of 2 to 6.5;
   optionally the pH adjusting agent;
   optionally the quaternary ammonium compound; and
   optionally the biocide.

3. The acid chemical mechanical polishing composition of claim 1, wherein the alkoxysilane succinic acid anhydride having formula (I) are selected from the group consisting of 3-trimethoxysilylpropyl succinic acid anhydride; 3-methyldimethoxysilylpropyl succinic acid anhydride; 3-dimethylmethoxysilylpropyl succinic acid anhydride; 3-triethoxysilylpropyl succinic acid anhydride; 3-methyldiethoxysilylpropyl succinic acid anhydride; 3-dimethylethoxysilylpropyl succinic acid anhydride; 3-tris-(methoxyethylenoxy)-silylpropyl succinic acid anhydride; 3-methylbis-(methoxyethylenoxy)-silylpropyl succinic acid anhydride; and 3-dimethylmethoxyethylenoxysilylpropyl succinic acid anhydride.

4. The acid chemical mechanical polishing composition of claim 1, wherein the colloidal silica abrasive particles having the positive zeta potential comprise a nitrogen containing compound.

5. The acid chemical mechanical polishing composition of claim 4, wherein the nitrogen containing compound is an aminosilane compound.

6. A method for chemical mechanical polishing of a substrate, comprising:
   providing a substrate, wherein the substrate comprises dielectric materials of silicon oxide, silicon nitride or combinations thereof;
   providing an acid chemical mechanical polishing composition, consisting of, as initial components:
   water;
   colloidal silica abrasive particles having a positive zeta potential;
   an alkoxysilane succinic acid anhydride in amounts of 0.0001 to 0.1 wt % having formula (I):

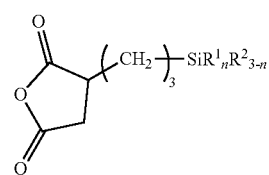

(I)

wherein $R^1$ is selected from $(C_1-C_4)$alkyl when n is 1 or 2; $R^2$ is methoxy, ethoxy, or methoxyethyleneoxy; and n can be 0, 1 or 2;
   a pH<7;
   optionally a pH adjusting agent;

optionally a quaternary ammonium compound; and
optionally a biocide;
  providing a chemical mechanical polishing pad with a polishing surface;
  creating dynamic contact at an interface between the polishing surface of the acid chemical mechanical polishing pad and the substrate with a down force of 0.69 to 34.5 kPa; and
  dispensing the acid chemical mechanical polishing composition onto the chemical mechanical polishing pad at or near the interface between the chemical mechanical polishing pad and the substrate;
  wherein the substrate is polished; and, wherein at least some of the silicon oxide, silicon nitride or combinations thereof is removed from the substrate.

7. The method of claim 6, wherein polishing is done at a platen speed of 93-113 revolutions per minute, a carrier speed of 87-111 revolutions per minute, an acid chemical mechanical polishing composition flow rate of 125-300 mL/min, a nominal down force of 21.4 kPa on a 200 mm polishing machine; and, wherein the chemical mechanical polishing pad comprises a polyurethane polishing layer containing polymeric hollow core microparticles and a polyurethane impregnated non-woven subpad.

8. The method of claim 6, wherein the acid chemical mechanical polishing composition provided consists of, as initial components:
  water;
  a colloidal silica abrasive particles having a positive zeta potential in amounts of 0.1 to 40 wt %;
  the alkoxysilane succinic acid anhydride of formula (I) in amounts of 0.00075 to 0.006 wt %;
  a pH of 2 to 6.5;
  optionally the pH adjusting agent;
  optionally the quaternary ammonium compound; and
  optionally the biocide.

9. The method of claim 6, wherein the alkoxysilane succinic acid anhydride having formula (I) are selected from the group consisting of 3-trimethoxysilylpropyl succinic acid anhydride; 3-methyldimethoxysilylpropyl succinic acid anhydride; 3-dimethylmethoxysilylpropyl succinic acid anhydride; 3-triethoxysilylpropyl succinic acid anhydride; 3-methyldiethoxysilylpropyl succinic acid anhydride; 3-dimethylethoxysilylpropyl succinic acid anhydride; 3-tris-(methoxyethylenoxy)-silylpropyl succinic acid anhydride; 3-methylbis-(methoxyethylenoxy)-silylpropyl succinic acid anhydride; and 3-dimethylmethoxyethylenoxysilylpropyl succinic acid anhydride.

10. The method of claim 6, wherein the colloidal silica abrasive particles having the positive zeta potential comprise a nitrogen containing compound.

* * * * *